US 11,463,116 B2

(12) United States Patent
Sawada et al.

(10) Patent No.: US 11,463,116 B2
(45) Date of Patent: Oct. 4, 2022

(54) RADIO FREQUENCY MODULE AND COMMUNICATION DEVICE

(71) Applicant: Murata Manufacturing Co., Ltd., Nagaokakyo (JP)

(72) Inventors: Yoichi Sawada, Nagaokakyo (JP); Takayuki Shinozaki, Nagaokakyo (JP); Yukiya Yamaguchi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 4 days.

(21) Appl. No.: 17/008,673

(22) Filed: Sep. 1, 2020

(65) Prior Publication Data

US 2021/0091800 A1   Mar. 25, 2021

(30) Foreign Application Priority Data

Sep. 20, 2019   (JP) .............................. JP2019-171752
Mar. 27, 2020   (JP) .............................. JP2020-057259

(51) Int. Cl.
*H04B 1/04*   (2006.01)
*H03F 3/24*   (2006.01)
*H03F 1/56*   (2006.01)

(52) U.S. Cl.
CPC .............. *H04B 1/04* (2013.01); *H03F 1/565* (2013.01); *H03F 3/245* (2013.01); *H03F 2200/165* (2013.01); *H03F 2200/171* (2013.01); *H03F 2200/222* (2013.01); *H03F 2200/294* (2013.01); *H03F 2200/387* (2013.01); *H03F 2200/451* (2013.01); *H04B 2001/045* (2013.01)

(58) Field of Classification Search
None
See application file for complete search history.

(56) References Cited

U.S. PATENT DOCUMENTS

| | | | |
|---|---|---|---|
| 9,451,566 B1* | 9/2016 | Morshedi | H04W 52/38 |
| 2004/0067771 A1* | 4/2004 | Wieck | G06F 1/182 |
| | | | 455/557 |
| 2005/0151599 A1* | 7/2005 | Ido | H05K 1/0243 |
| | | | 333/133 |
| 2012/0112970 A1* | 5/2012 | Caballero | H01Q 7/00 |
| | | | 343/702 |

(Continued)

FOREIGN PATENT DOCUMENTS

| | | |
|---|---|---|
| JP | 2017-098630 A | 6/2017 |
| JP | 2018-42192 A | 3/2018 |
| WO | 2018/168500 A1 | 9/2018 |

OTHER PUBLICATIONS

Korean Office Action dated Aug. 25, 2021, in corresponding Korean Patent Application No. 10-2020-0110706.

*Primary Examiner* — Pablo N Tran
(74) *Attorney, Agent, or Firm* — Xsensus LLP

(57) ABSTRACT

A radio frequency module includes: a module board including a first principal surface and a second principal surface on opposite sides of the module board; a transmission power amplifier configured to amplify a transmission signal; a first switch; and a first inductor included in a matching circuit connected between an output terminal of the transmission power amplifier and the first switch. The first inductor is disposed on the first principal surface, and the first switch is disposed on the second principal surface.

20 Claims, 3 Drawing Sheets

(56) References Cited

U.S. PATENT DOCUMENTS

| | | | |
|---|---|---|---|
| 2014/0038675 A1* | 2/2014 | Khlat | H04L 5/001 455/574 |
| 2014/0227982 A1* | 8/2014 | Granger-Jones | H04B 1/0064 455/77 |
| 2016/0035678 A1* | 2/2016 | Yoo | H01L 23/3128 257/737 |
| 2016/0094254 A1* | 3/2016 | Ripley | H04B 1/1607 455/114.3 |
| 2016/0190995 A1* | 6/2016 | Penticoff | H03F 3/195 330/295 |
| 2016/0241208 A1* | 8/2016 | Lehtola | H03F 3/19 |
| 2017/0195106 A1* | 7/2017 | Pehlke | H04B 1/006 |
| 2019/0155782 A1* | 5/2019 | Lin | G06F 30/30 |

* cited by examiner

RADIO FREQUENCY MODULE AND COMMUNICATION DEVICE

CROSS REFERENCE TO RELATED APPLICATIONS

The present application is based on and claims priority of Japanese Patent Application No. 2019-171752 filed on Sep. 20, 2019 and Japanese Patent Application No. 2020-057259 filed on Mar. 27, 2020. The entire disclosures of the above-identified applications, including the specifications, drawings and claims are incorporated herein by reference in their entirety.

FIELD

The present disclosure relates to a radio frequency module and a communication device.

BACKGROUND

In mobile communication apparatuses such as mobile phones, the arrangement of circuit elements included in radio frequency front-end circuits is becoming complex, particularly with developments in multiband technologies.

Japanese Unexamined Patent Application Publication No. 2017-98630 discloses a front-end module including: a plurality of transmission and reception paths (transmission paths and reception paths) for transmitting and receiving radio frequency signals of predetermined communication bands (frequency bands); an antenna switch (an input switch) connected to the plurality of transmission and reception paths; a transmission selection switch (an output switch) connected to the plurality of transmission paths; an antenna matching circuit connected between the antenna switch and an antenna connection terminal; and a transmission output matching circuit connected between the transmission selection switch and a radio frequency (RF) integrated circuit (IC) input and output terminal. The antenna matching circuit and the transmission output matching circuit include at least one of an inductor or a capacitor. The front-end module reduces deterioration of isolation between the input and the output by optimizing the arrangement, in the peripheral portion of a switch IC, of filters and matching circuits which are disposed on the transmission and reception paths.

SUMMARY

Technical Problems

When the front-end module disclosed in Japanese Unexamined Patent Application Publication No. 2017-98630 is realized as a miniaturized radio frequency module, however, electromagnetic coupling may occur between the transmission selection switch connected to the plurality of transmission paths and the transmission output matching circuit. In that case, a high-output transmission signal transferred via a transmission path selected by the transmission selection switch may, due the electromagnetic coupling, leak into a transmission path that is not selected by the transmission selection switch, and cause deterioration of the quality of the transmission signal selected by the transmission selection switch.

The present disclosure is to address the above problems, and provides a miniaturized radio frequency module and a communication device that reduce deterioration of the quality of a transmission signal.

Solutions

A radio frequency module according to an aspect of the present disclosure is a radio frequency module including: a module board including a first principal surface and a second principal surface on opposite sides of the module board; a power amplifier configured to amplify a transmission signal; a first switch; and a first inductor connected between an output terminal of the power amplifier and the first switch. The first inductor is disposed on the first principal surface, and the first switch is disposed on the second principal surface.

Advantageous Effects

According to the present disclosure, it is possible to provide a miniaturized radio frequency module and a communication device that reduce deterioration of the quality of a transmission signal.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1:
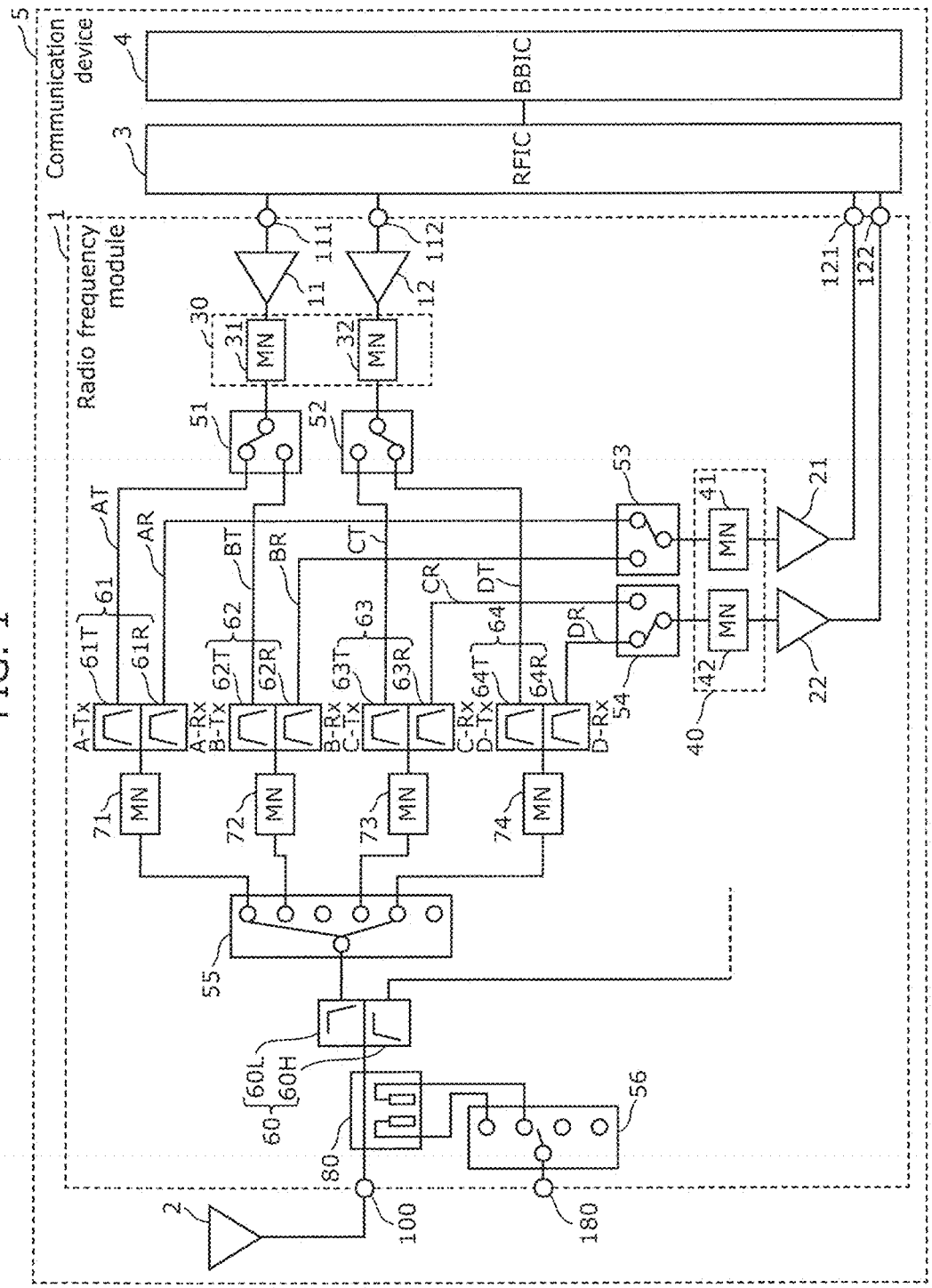
FIG. 1 illustrates a circuit configuration of a radio frequency module according to an embodiment.

Hereinafter, embodiments of the present disclosure will be described in detail. Note that the embodiments described below each illustrate a general or specific example. The numerical values, shapes, materials, constituent elements, the arrangement and connection of the constituent elements, etc., illustrated in the embodiment below are mere examples, and are therefore not intended to limit the present disclosure. Among the constituent elements in the following working examples and variations, constituent elements not recited in the independent claims will be described as optional constituent elements. In addition, the sizes of constituent elements and the ratios of the sizes illustrated in the drawings are not necessarily precise. In the drawings, essentially the same constituent elements share the same reference signs, and redundant descriptions will be omitted or simplified.

In the following description, terms indicating relationships between elements, e.g., "parallel" and "vertical", terms indicating the shapes of elements, e.g., "quadrilateral", and value ranges do not have the meanings in the strict sense only, but include essentially equivalent value ranges and meanings, for example deviations of about a few percent.

Additionally, in the following description, when A, B, and C are mounted on a board, and "C is disposed between A and B in a plan view of the board (or in a plan view of a principal surface of the board)", it means that at least one of a plurality of line segments connecting a given point in A and a given point in B passes through the region of C in a plan view of the board. Furthermore, a plan view of the board means that the board and circuit elements mounted on the board are orthographically projected on a plane parallel to a principal surface of the board.

Further, in the following description, the phrase "A is disposed on a first principal surface of a board" means not only that A is directly mounted on the first principal surface, but also that, of a space on the first principal surface side and a space on the second principal surface side that are separated by the board, A is disposed in the space on the first principal surface side. That is to say, the above phrase encompasses the meaning that A is mounted on the first principal surface via another circuit element or electrode, for example.

In the following description, a "transmission path" refers to a transfer path including, for example, a line for transferring radio frequency transmission signals, an electrode directly connected to the line, and a terminal directly connected to the line or the electrode. A "reception path" refers to a transfer path including, for example, a line for transferring radio frequency reception signals, an electrode directly connected to the line, and a terminal directly connected to the line or the electrode. A "signal path" refers to a transfer path including, for example, a line for transferring radio frequency signals, an electrode directly connected to the line, and a terminal directly connected to the line or the electrode.

EMBODIMENT

[1. Circuit Configuration of Radio Frequency Module 1 and Communication Device 5]

FIG. 1 illustrates a circuit configuration of radio frequency module 1 according to an embodiment. As illustrated in this figure, communication device 5 includes radio frequency module 1, antenna 2, radio frequency (RF) signal processing circuit (RF integrated circuit (IC)) 3, and baseband signal processing circuit (BBIC) 4.

RFIC 3 is an RF signal processing circuit that processes a radio frequency signal which is to be transmitted by antenna 2 and a radio frequency signal which has been received by antenna 2. Specifically, RFIC 3 processes reception signals input via reception paths of radio frequency module 1 by down-conversion, for example, and outputs resultant reception signals to BBIC 4. RFIC 3 also processes transmission signals input from BBIC 4 by up-conversion, for example, and outputs resultant transmission signals to transmission paths of radio frequency module 1.

BBIC 4 is a circuit that performs signal processing using the intermediate frequency band lower than the frequency band of a radio frequency signal transferred by radio frequency module 1. The signal processed by BBIC 4 is used as, for example, an image signal for image display, or an audio signal for talk through a loudspeaker.

RFIC 3 also functions as a controller that controls connections of switches 51, 52, 53, 54, 55, and 56 included in radio frequency module 1 based on a communication band (frequency band) used. Specifically, RFIC 3 switches the connections of switches 51 to 56 included in radio frequency module 1 according to control signals (not illustrated). Note that the controller may be provided outside RFIC 3; for example in BBIC 4.

Antenna 2 is connected to antenna connection terminal 100 of radio frequency module 1, radiates a radio frequency signal output from radio frequency module 1, receives a radio frequency signal from outside, and outputs the received radio frequency signal to radio frequency module 1.

Note that in communication device 5 according to the present embodiment, antenna 2 and BBIC 4 are optional components.

Next, a detailed configuration of radio frequency module 1 will be described.

As illustrated in FIG. 1, radio frequency module 1 includes antenna connection terminal 100, transmission power amplifiers 11 and 12, reception low noise amplifiers 21 and 22, transmission filters 61T, 62T, 63T, and 64T, reception filters 61R, 62R, 63R, and 64R, transmission output matching circuit 30, reception input matching circuit 40, matching circuits 71, 72, 73, and 74, switches 51, 52, 53, 54, 55, and 56, transmission paths AT, BT, CT, and DT, reception paths AR, BR, CR, and DR, diplexer 60, coupler 80, and coupler output terminal 180.

Antenna connection terminal 100 is an antenna common terminal connected to antenna 2.

Transmission power amplifier 11 is a power amplifier that amplifies transmission signals of communication band A (a first communication band) and communication band B (a second communication band) which belong to a first frequency band group. The radio frequency signals of communication bands A and B are input through transmission input terminal 111. Transmission power amplifier 12 is a power amplifier that amplifies transmission signals of communication band C and communication band D which belong to a second frequency band group different from the first frequency band group. The radio frequency signals of communication bands C and D are input through transmission input terminal 112.

Reception low noise amplifier 21 is a low noise amplifier that amplifies reception signals of communication bands A and B, and outputs the amplified signals to reception output terminal 121. Reception low noise amplifier 22 is a low noise amplifier that amplifies reception signals of communication bands C and D, and outputs the amplified signals to reception output terminal 122.

Transmission path AT is for transferring transmission signals of communication band A. One end of transmission path AT is connected to antenna connection terminal 100, and the other end of transmission path AT is connected to transmission power amplifier 11. Transmission path BT is for transferring transmission signals of communication band B. One end of transmission path BT is connected to antenna connection terminal 100, and the other end of transmission path BT is connected to transmission power amplifier 11. Transmission path CT is for transferring transmission signals of communication band C. One end of transmission path CT is connected to antenna connection terminal 100, and the other end of transmission path CT is connected to transmission power amplifier 12. Transmission path DT is for transferring transmission signals of communication band D. One end of transmission path DT is connected to antenna connection terminal 100, and the other end of transmission path DT is connected to transmission power amplifier 12.

Reception path AR is for transferring reception signals of communication band A. One end of reception path AR is connected to antenna connection terminal 100, and the other end of reception path AR is connected to reception low noise amplifier 21. Reception path BR is for transferring reception signals of communication band B. One end of reception path BR is connected to antenna connection terminal 100, and the other end of reception path BR is connected to reception low noise amplifier 21. Reception path CR is for transferring reception signals of communication band C. One end of reception path CR is connected to antenna connection terminal 100, and the other end of reception path CR is connected to reception low noise amplifier 22. Reception path DR is for transferring reception signals of communication band D. One end of reception path DR is connected to antenna connection terminal 100, and the other end of reception path DR is connected to reception low noise amplifier 22.

Transmission filter 61T is disposed on transmission path AT. Among the transmission signals amplified by transmission power amplifier 11, transmission signals in the transmission range of communication band A pass through transmission filter 61T. Transmission filter 62T is disposed on transmission path BT. Among the transmission signals amplified by transmission power amplifier 11, transmission signals in the transmission range of communication band B pass through transmission filter 62T. Transmission filter 63T is disposed on transmission path CT. Among the transmission signals amplified by transmission power amplifier 12, transmission signals in the transmission range of communication band C pass through transmission filter 63T. Transmission filter 64T is disposed on transmission path DT. Among the transmission signals amplified by transmission power amplifier 12, transmission signals in the transmission range of communication band D pass through transmission filter 64T.

Reception filter 61R is disposed on reception path AR. Among reception signals input from antenna connection terminal 100, reception signals in the reception range of communication band A pass through reception filter 61R. Reception filter 62R is disposed on reception path BR. Among the reception signals input from antenna connection terminal 100, reception signals in the reception range of communication band B pass through reception filter 62R. Reception filter 63R is disposed on reception path CR. Among the reception signals input from antenna connection terminal 100, reception signals in the reception range of communication band C pass through reception filter 63R. Reception filter 64R is disposed on reception path DR. Among the reception signals input from antenna connection terminal 100, reception signals in the reception range of communication band D pass through reception filter 64R.

Transmission filter 61T and reception filter 61R constitute duplexer 61 having communication band A as the passband. Transmission filter 62T and reception filter 62R constitute duplexer 62 having communication band B as the passband. Transmission filter 63T and reception filter 63R constitute duplexer 63 having communication band C as the passband. Transmission filter 64T and reception filter 64R constitute duplexer 64 having communication band D as the passband.

Transmission output matching circuit 30 includes matching circuits 31 and 32. Matching circuit 31 is disposed on transmission paths AT and BT connecting transmission power amplifier 11 and transmission filters 61T and 62T, respectively. Matching circuit 31 matches the impedance of transmission power amplifier 11 with the impedance of transmission filter 61T, and matches the impedance of transmission power amplifier 11 with the impedance of transmission filter 62T. Matching circuit 32 is disposed on transmission paths CT and DT connecting transmission power amplifier 12 and transmission filters 63T and 64T, respectively. Matching circuit 32 matches the impedance of transmission power amplifier 12 with the impedance of transmission filter 63T, and matches the impedance of transmission power amplifier 12 with the impedance of transmission filter 64T. Matching circuits 31 and 32 each include a first inductor which is a chip inductor.

Reception input matching circuit 40 includes matching circuits 41 and 42. Matching circuit 41 is disposed on reception paths AR and BR connecting reception low noise amplifier 21 and reception filters 61R and 62R, respectively, and matches the impedance of reception low noise amplifier 21 with the impedances of reception filters 61R and 62R. Matching circuit 42 is disposed on reception paths CR and DR connecting reception low noise amplifier 22 and reception filters 63R and 64R, respectively, and matches the impedance of reception low noise amplifier 22 with the impedances of reception filters 63R and 64R. Matching circuits 41 and 42 each include a second inductor which is a chip inductor.

Switch 51 is an example of a first switch, and includes a common terminal and two selection terminals. The common terminal of switch 51 is connected to the output terminal of transmission power amplifier 11 via matching circuit 31. One of the selection terminals of switch 51 is connected to transmission filter 61T disposed on transmission path AT, and the other selection terminal of switch 51 is connected to transmission filter 62T disposed on transmission path BT. In this connection configuration, switch 51 switches between connection of the common terminal to one selection terminal and connection of the common terminal to the other selection terminal. In other words, switch 51 switches connection and disconnection of transmission power amplifier 11 with transmission filter 61T, and also switches connection and disconnection of transmission power amplifier 11 with transmission filter 62T. Switch 51 is a single pole double throw (SPDT) switch circuit, for example.

Switch 52 is an example of the first switch, and includes a common terminal and two selection terminals. The common terminal of switch 52 is connected to the output terminal of transmission power amplifier 12 via matching circuit 32. One of the selection terminals of switch 52 is connected to transmission filter 63T disposed on transmission path CT, and the other selection terminal of switch 52 is connected to transmission filter 64T disposed on transmission path DT. In this connection configuration, switch 52 switches between connection of the common terminal to one selection terminal and connection of the common terminal to the other selection terminal. In other words, switch 52 switches connection and disconnection of transmission power amplifier 12 with transmission filter 63T, and also switches connection and disconnection of transmission power amplifier 12 with transmission filter 64T. Switch 52 is an SPDT switch circuit, for example.

Switch 53 includes a common terminal and two selection terminals. The common terminal of switch 53 is connected to the input terminal of reception low noise amplifier 21 via matching circuit 41. One of the selection terminals of switch 53 is connected to reception filter 61R disposed on reception path AR, and the other selection terminal of switch 53 is connected to reception filter 62R disposed on reception path BR. In this connection configuration, switch 53 switches between connection of the common terminal to one selection terminal and connection of the common terminal to the other selection terminal. In other words, switch 53 switches connection and disconnection of reception low noise amplifier 21 with reception path AR, and also switches connection and disconnection of reception low noise amplifier 21 with reception path BR. Switch 53 is an SPDT switch circuit, for example.

Switch 54 includes a common terminal and two selection terminals. The common terminal of switch 54 is connected to the input terminal of reception low noise amplifier 22 via matching circuit 42. One of the selection terminals of switch 54 is connected to reception filter 63R disposed on reception path CR, and the other selection terminal of switch 54 is connected to reception filter 64R disposed on reception path DR. In this connection configuration, switch 54 switches between connection of the common terminal to one selection terminal and connection of the common terminal to the other selection terminal. In other words, switch 54 switches connection and disconnection of reception low noise amplifier 22 with reception path CR, and also switches connection and disconnection of reception low noise amplifier 22 with reception path DR. Switch 54 is an SPDT switch circuit, for example.

Switch 55 is an example of an antenna switch. Switch 55 is connected to antenna connection terminal 100 via diplexer 60, and switches (1) connection of antenna connection terminal 100 to transmission path AT and reception path AR, (2) connection of antenna connection terminal 100 to transmission path BT and reception path BR, (3) connection of antenna connection terminal 100 to transmission path CT and reception path CR, and (4) connection of antenna connection terminal 100 to transmission path DT and reception path DR. Note that switch 55 includes a multiple-connection switch circuit capable of simultaneously establishing two or more of the connections (1) to (4) described above.

Matching circuit 71 is disposed on a path connecting switch 55 and duplexer 61, and matches the impedance of antenna 2 and switch 55 with the impedance of duplexer 61. Matching circuit 72 is disposed on a path connecting switch 55 and duplexer 62, and matches the impedance of antenna 2 and switch 55 with the impedance of duplexer 62. Matching circuit 73 is disposed on a path connecting switch 55 and duplexer 63, and matches the impedance of antenna 2 and switch 55 with the impedance of duplexer 63. Matching circuit 74 is disposed on a path connecting switch 55 and duplexer 64, and matches the impedance of antenna 2 and switch 55 with the impedance of duplexer 64. Matching circuits 71 to 74 each include a second inductor which is a chip inductor.

Diplexer 60 is an example of a multiplexer, and includes filters 60L and 60H. Filter 60L is an example of an LC filter that includes a third inductor which is a chip inductor. Filter 60L is a filter having, as the passband, a frequency range including the first frequency band group and the second frequency band group. Filter 60H is an example of an LC filter that includes a third inductor which is a chip inductor. Filter 60H is a filter having, as the passband, a frequency range including another frequency band group different from the first frequency band group and the second frequency band group. One terminal of filter 60L and one terminal of filter 60H are connected commonly to antenna connection terminal 100. Note that when the first frequency band group and the second frequency band group are lower than the above other frequency band group, filter 60L may be a low-pass filter and filter 60H may be a high-pass filter. Diplexer 60 may include only filter 60L having a chip inductor, and in such a case, may be a matching circuit having an impedance matching function.

Coupler 80 and switch 56 form a circuit that monitors the power intensity of radio frequency signals transferred between antenna connection terminal 100 and switch 55, and output the monitored power intensity to, for example, RFIC 3 via coupler output terminal 180.

Note that transmission filters 61T to 64T and reception filters 61R to 64R described above may each be, but are not limited to, any of, for example, an acoustic wave filter that uses surface acoustic waves (SAWs), an acoustic wave filter that uses bulk acoustic waves (BAWs), an LC resonance filter, and a dielectric filter.

Transmission power amplifiers 11 and 12 and reception low noise amplifiers 21 and 22 are each configured using, for example, a field effect transistor (FET) or a hetero-junction bipolar transistor (HBT) including, for instance, an Si-based complementary metal oxide semiconductor (CMOS) or GaAs as a material.

Reception low noise amplifiers 21 and 22 and switches 53, 54, and 55 may be formed in a semiconductor integrated circuit (IC). Additionally, the semiconductor IC may include transmission power amplifiers 11 and 12 and switches 51 and 52. The semiconductor IC includes a CMOS, for example, and is specifically formed by the silicon on insulator (SOI) process. Accordingly, the semiconductor IC can be manufactured at low cost. Note that the semiconductor IC may include at least one of GaAs, SiGe, or GaN. Accordingly, a radio frequency signal having high quality of amplification and noise properties can be output.

Note that matching circuits 71 to 74, coupler 80, switch 56, and coupler output terminal 180 are not essential to the radio frequency module according to the present disclosure.

In the configuration of radio frequency module 1 described above, transmission power amplifier 11, matching circuit 31, switch 51, transmission filter 61T, matching circuit 71, switch 55, filter 60L, and transmission path AT are included in a first transmitter circuit that transfers transmission signals of communication band A to antenna connection terminal 100. Filter 60L, switch 55, matching circuit 71, reception filter 61R, switch 53, matching circuit 41, reception low noise amplifier 21, and reception path AR are included in a first receiver circuit that transfers reception signals of communication band A from antenna 2 via antenna connection terminal 100.

Transmission power amplifier 11, matching circuit 31, switch 51, transmission filter 62T, matching circuit 72, switch 55, filter 60L, and transmission path BT are included in a second transmitter circuit that transfers transmission signals of communication band B to antenna connection terminal 100. Filter 60L, switch 55, matching circuit 72, reception filter 62R, switch 53, matching circuit 41, reception low noise amplifier 21, and reception path BR are included in a second receiver circuit that transfers reception signals of communication band B from antenna 2 via antenna connection terminal 100.

Transmission power amplifier 12, matching circuit 32, switch 52, transmission filter 63T, matching circuit 73, switch 55, filter 60L, and transmission path CT are included in a third transmitter circuit that transfers transmission signals of communication band C to antenna connection terminal 100. Filter 60L, switch 55, matching circuit 73, reception filter 63R, switch 54, matching circuit 42, reception low noise amplifier 22, and reception path CR are included in a third receiver circuit that transfers reception signals of communication band C from antenna 2 via antenna connection terminal 100.

Transmission power amplifier 12, matching circuit 32, switch 52, transmission filter 64T, matching circuit 74, switch 55, filter 60L, and transmission path DT are included in a fourth transmitter circuit that transfers transmission signals of communication band D to antenna connection terminal 100. Filter 60L, switch 55, matching circuit 74, reception filter 64R, switch 54, matching circuit 42, reception low noise amplifier 22, and reception path DR are included in a fourth receiver circuit that transfers reception signals of communication band D from antenna 2 via antenna connection terminal 100.

According to the above circuit configuration, radio frequency module 1 can simultaneously transmit, receive, and/or transfer a radio frequency signal of communication band A or B and a radio frequency signal of communication band C or D.

Note that in the radio frequency module according to the present disclosure, the above four transmitter circuits and four receiver circuits need not be connected to antenna connection terminal 100 via switch 55, and may be connected to antenna 2 via different terminals. It is sufficient if the radio frequency module according to the present disclosure includes the first transmitter circuit and the second transmitter circuit. It is sufficient if the first transmitter circuit includes transmission power amplifier 11, matching circuit 31, and switch 51. It is sufficient if the second transmitter circuit includes transmission power amplifier 12, matching circuit 32, and switch 52.

Here, in the case of mounting each circuit element included in radio frequency module 1 on a single module board as a small front-end circuit, it is necessary to reduce the layout area for circuit components on the module board surface. In that case, electromagnetic coupling may occur between matching circuit 31 and switch 51 connected to transmission paths AT and BT. Electromagnetic coupling may also occur between matching circuit 32 and switch 52 connected to transmission paths CT and DT. In such cases, for example, a high-output transmission signal transferred via transmission path AT selected by switch 51 may, due the electromagnetic coupling, leak into transmission path BT that is not selected by switch 51, and cause deterioration of the quality of the transmission signal selected by switch 51. Further, for example, a high-output transmission signal transferred via transmission path CT selected by switch 52 may, due the electromagnetic coupling, leak into transmission path DT that is not selected by switch 52, and cause deterioration of the quality of the transmission signal selected by switch 52.

In view of this, radio frequency module 1 according to the present embodiment has a configuration that reduces electromagnetic coupling between chip inductors included in matching circuits 31 and 32 and switches 51 and 52. The following describes a configuration of radio frequency module 1 according to the present embodiment that reduces the electromagnetic coupling.

[2. Arrangement of Circuit Elements of Radio Frequency Module 1A According to a Working Example]

Figure 2A:
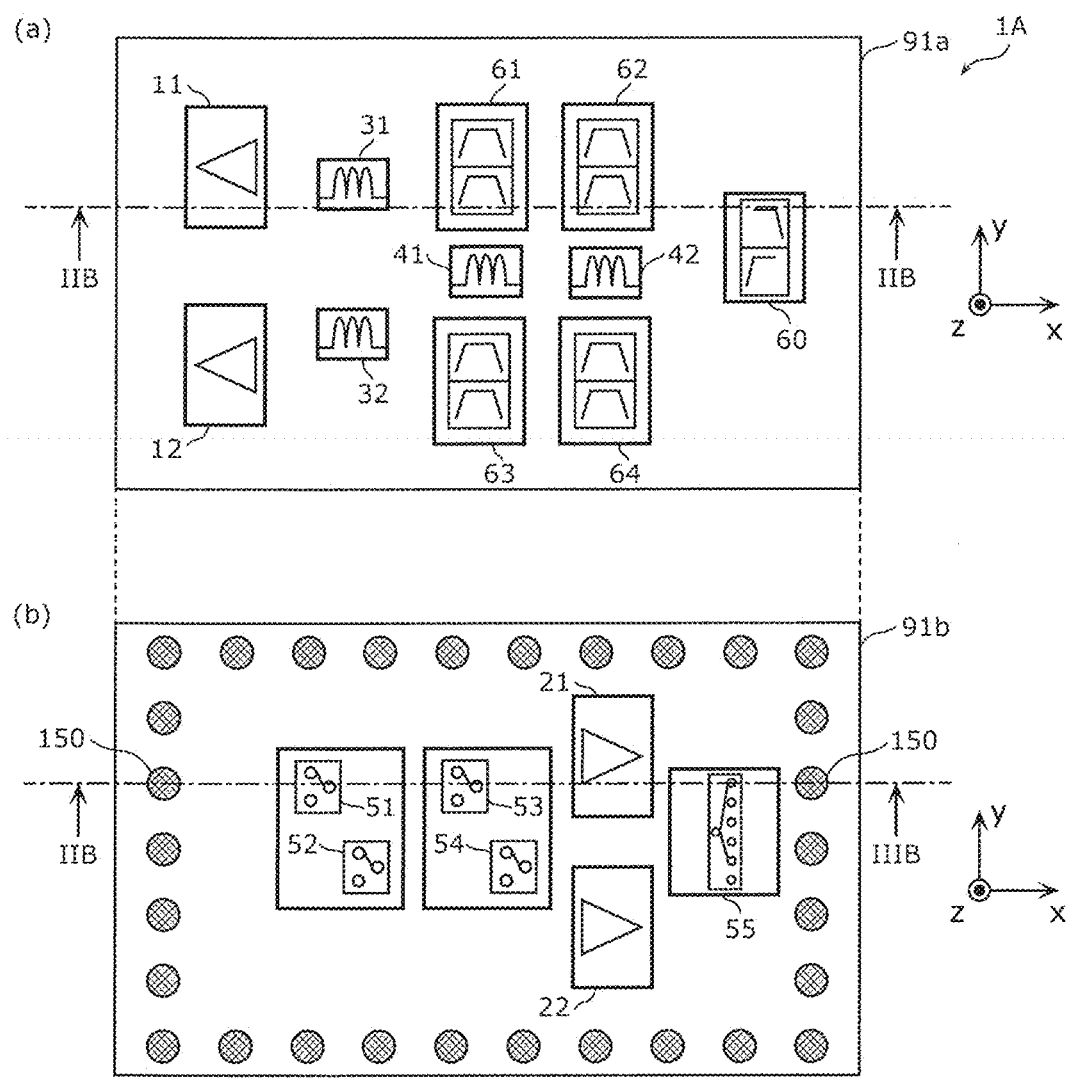
FIG. 2A is a schematic diagram illustrating a plan view configuration of a radio frequency module according to a working example.
Figure 2B:
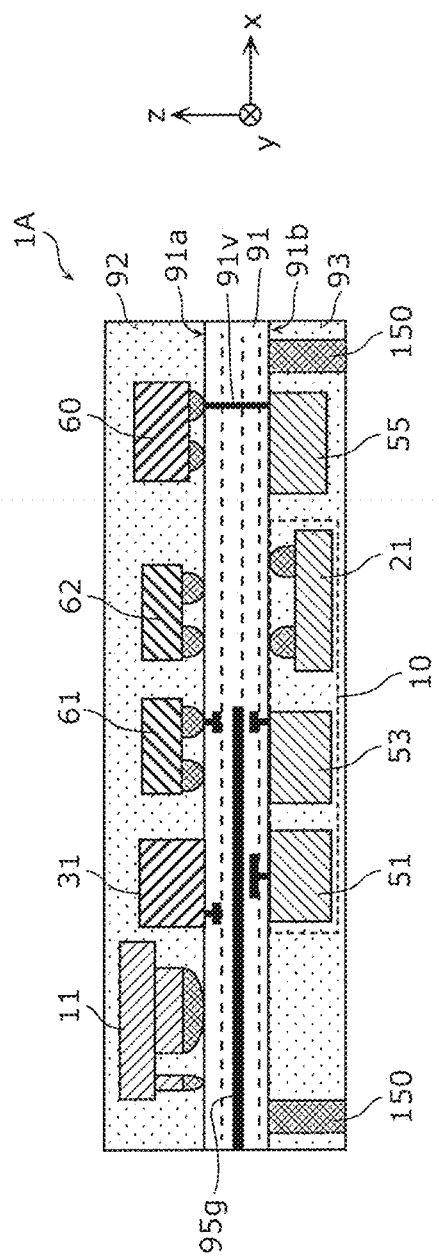
FIG. 2B is a schematic diagram illustrating a cross-sectional configuration of the radio frequency module according to the working example.

FIG. 2A is a schematic diagram illustrating a plan view configuration of radio frequency module 1A according to a working example. FIG. 2B is a schematic diagram illustrating a cross-sectional configuration of radio frequency module 1A according to the working example, and is specifically a cross-sectional view taken at line IIB-IIB in FIG. 2A. Note that part (a) of FIG. 2A illustrates how circuit elements are arranged when, of principal surfaces 91a and 91b located on opposite sides of module board 91, principal surface 91a is viewed from the z-axis positive side. Part (b) of FIG. 2A is a perspective view illustrating how circuit elements are arranged when principal surface 91b is viewed from the z-axis positive side.

Radio frequency module 1A according to the working example is to specifically show an arrangement of circuit elements included in radio frequency module 1 according to the embodiment.

As illustrated in FIG. 2A and FIG. 2B, radio frequency module 1A according to this working example includes module board 91, resin components 92 and 93, and external-connection terminals 150 in addition to the circuit configuration illustrated in FIG. 1.

Module board 91 is a board which includes principal surface 91a (a first principal surface) and principal surface 91b (a second principal surface) on opposite sides of module board 91, and on which the above-described transmitter circuits and receiver circuits are mounted. Examples of a board used for module board 91 include a low temperature co-fired ceramics (LTCC) board having a configuration in which a plurality of dielectric layers are stacked, a high temperature co-fired ceramics (HTCC) board, a component-embedded board, a board having a redistribution layer (RDL), and a printed circuit board.

Resin component 92 is disposed on principal surface 91a of module board 91, and covers a part of the transmitter circuits, a part of the receiver circuits, and principal surface 91a of module board 91. Resin component 92 has a function to ensure the reliability of circuit elements included in the transmitter circuits and receiver circuits, such as the mechanical strength and moisture resistance. Resin component 93 is disposed on principal surface 91b of module board 91, and covers a part of the transmitter circuits, a part of the receiver circuits, and principal surface 91b of module board 91. Resin component 93 has a function to ensure the reliability of circuit elements included in the transmitter circuits and receiver circuits, such as the mechanical strength and moisture resistance. Note that resin components 92 and 93 are not essential to the radio frequency module according to the present disclosure.

Matching circuits 31, 32, 41, 42, 71 to 74 each include at least a chip inductor.

As illustrated in FIG. 2A and FIG. 2B, in radio frequency module 1A according to this working example, transmission power amplifiers 11 and 12, duplexers 61 to 64, matching circuits 31, 32, 41, and 42, and diplexer 60 are surface-mounted on principal surface 91a of module board 91. Reception low noise amplifiers 21 and 22, and switches 51 to 55 are surface-mounted on principal surface 91b of module board 91. Although matching circuits 71 to 74 and coupler 80 are not illustrated in FIG. 2A and FIG. 2B, they may be surface-mounted on any of principal surfaces 91a and 91b of module board 91, or may be embedded in module board 91.

Note that, although not illustrated in FIG. 2A, the lines forming transmission paths AT, BT, CT, and DT and reception paths AR, BR, CR, and DR illustrated in FIG. 1 are formed in principal surfaces 91a and 91b and the inside of module board 91. The lines each may be a bondwire each end of which is joined to principal surface 91a or 91b or any of the circuit elements included in radio frequency module 1A, and may be a terminal, an electrode, or a line formed in the surface of a circuit element included in radio frequency module 1A.

In the present working example, matching circuits 31 and 32 are disposed on principal surface 91a, and switches 51 and 52 are disposed on principal surface 91b.

According to this configuration, the first inductors included in matching circuits 31 and 32 are disposed on principal surface 91a of module board 91, whereas switches 51 and 52 are disposed on principal surface 91b. In other words, the first inductors and switches 51 and 52 are disposed with module board 91 interposed therebetween. According to this, it is possible to reduce electromagnetic coupling between the first inductors and switches 51 and 52 which occurs when a high-output transmission signal of any of communication bands A to D output from transmission power amplifier 11 or 12 is transferred via any of transmission paths AT to DT. Thus, for example, it is possible to reduce leakage of a high-output transmission signal transferred via transmission path AT selected by switch 51 into transmission path BT not selected by switch 51 due the electromagnetic coupling, which would cause deterioration of the quality of the transmission signal selected by switch 51. Further, for example, it is possible to reduce leakage of a high-output transmission signal transferred via transmission path CT selected by switch 52 into transmission path DT not selected by switch 52 due the electromagnetic coupling, which would cause deterioration of the quality of the transmission signal selected by switch 52. Accordingly, it is possible to provide miniaturized radio frequency module 1A that reduces the deterioration of the quality of a transmission signal.

Note that it is sufficient if radio frequency module 1 according to the present disclosure has either (1) an arrangement in which the first inductor included in matching circuit 31 is disposed on principal surface 91a, and switch 51 is disposed on principal surface 91b, or (2) an arrangement in which the first inductor included in matching circuit 32 is disposed on principal surface 91a, and switch 52 is disposed on principal surface 91b. According to this, it is possible to provide miniaturized radio frequency module 1 that reduces deterioration of the quality of at least transmission signals of communication bands A and B or transmission signals of communication bands C and D.

As illustrated in FIG. 2B, in radio frequency module 1A according to this working example, module board 91 includes ground electrode layer 95g formed in a direction parallel to principal surfaces 91a and 91b and set to a ground potential. For example, module board 91 has a multi-layer structure in which a plurality of dielectric layers are stacked, and ground electrode layer 95g is formed in at least one of the dielectric layers. This enhances the electromagnetic-field shielding function of module board 91.

Here, as illustrated in FIG. 2B, in a plan view of module board 91, it is desirable that the first inductors included in matching circuits 31 and 32 and ground electrode layer 95g overlap at least partially, and switches 51 and 52 and ground electrode layer 95g overlap at least partially.

According to this, with the electromagnetic-field shielding function of ground electrode layer 95g, it is possible to inhibit the electromagnetic field generated by the first inductors from reaching the principal surface 91b side, and inhibit the electromagnetic field generated by switches 51 and 52 from reaching the principal surface 91a side. It is thus possible to further reduce the electromagnetic coupling between the first inductors and switches 51 and 52.

Note that it is sufficient if radio frequency module 1 according to the present disclosure has either (1) an arrangement in which, in a plan view of module board 91, the first inductor included in matching circuit 31 and ground electrode layer 95g overlap at least partially, and switch 51 and ground electrode layer 95g overlap at least partially, or (2) an arrangement in which, in a plan view of module board 91, the first inductor included in matching circuit 32 and ground electrode layer 95g overlap at least partially, and switch and ground electrode layer 95g overlap at least partially. According to this, it is possible to further reduce at least one of the electromagnetic coupling between the first inductor included in matching circuit 31 and switch 51 or the electromagnetic coupling between the first inductor included in matching circuit 32 and switch 52.

In a plan view of module board 91, it is desirable that the first inductor included in matching circuit 31 and switch 51 overlap at least partially, and the first inductor included in matching circuit 32 and switch 52 overlap at least partially.

According to this, since the first inductor included in matching circuit 31 and switch 51 are disposed in opposite positions on opposite side of module board 91, it is possible to shorten a length of a line connecting matching circuit 31 and switch 51, and reduce transfer loss of transmission signals of communication bands A and B. Further, since the first inductor included in matching circuit 32 and switch 52 are disposed in opposite positions on opposite sides of module board 91, it is possible to shorten a length of a line connecting matching circuit 32 and switch 52, and reduce transfer loss of transmission signals of communication bands C and D.

Note that it is sufficient if radio frequency module 1 according to the present disclosure has either (1) an arrangement in which a footprint of the first inductor included in matching circuit 31 at least partially overlaps with a footprint of the switch 51 in a plan view of module board 91, or (2) an arrangement in which a footprint of the first inductor included in matching circuit 32 at least partially overlaps a footprint of switch 52 in a plan view of module board 91.

According to this, it is possible to reduce at least one of transfer loss of transmission signals of communication bands A and B or transfer loss of transmission signals of communication bands C and D.

Radio frequency module 1A according to this working example further includes a plurality of external-connection terminals 150 disposed on principal surface 91b. Radio frequency module 1A transmits and receives electric signals to and from a motherboard that is disposed on the z-axis negative side of radio frequency module 1A, via the plurality of external-connection terminals 150.

Note that antenna connection terminal 100 may be one of the plurality of external-connection terminals 150, and may be formed in a position adjacent to switch 55 on principal surface 91b (not illustrated in FIG. 2A). This arrangement makes it possible to shorten a length of a line connecting antenna connection terminal 100 and switch 55, thus enabling reduction of transfer loss of transmission signals and reception signals transferred by radio frequency module 1A.

Transmission input terminals 111 and 112 may be two of the plurality of external-connection terminals 150, and may be formed in positions opposite transmission power amplifiers 11 and 12 with module board 91 interposed therebetween (not illustrated in FIG. 2A). This arrangement makes it possible to shorten a length of a line connecting transmission input terminal 111 and transmission power amplifier 11 and a line connecting transmission input terminal 112 and transmission power amplifier 12, thus enabling reduction of transfer loss of transmission signals transferred by radio frequency module 1A.

Reception output terminals 121 and 122 may be two of the plurality of external-connection terminals 150, and may be formed in positions adjacent to reception low noise amplifiers 21 and 22 on principal surface 91b (not illustrated in FIG. 2A). This arrangement makes it possible to shorten a length of a line connecting reception output terminal 121 and reception low noise amplifier 21 and a line connecting reception output terminal 122 and reception low noise amplifier 22, thus enabling reduction of transfer loss of reception signals transferred by radio frequency module 1A.

Some of external-connection terminals 150 are set to the ground potential of the motherboard. Of principal surfaces 91a and 91b, transmission power amplifiers 11 and 12 that cannot be readily reduced in profile are not disposed on principal surface 91b facing the motherboard, but reception low noise amplifiers 21 and 22 and switches 51 to 55 that can be readily reduced in profile are disposed on principal surface 91b, thus enabling profile reduction of radio frequency module 1A as a whole. Moreover, since a plurality of external-connection terminals 150 that are used as ground electrodes are disposed in the vicinity of reception low noise amplifiers 21 and 22 that have a significant impact on the reception sensitivity of the receiver circuits, it is possible to reduce deterioration of the reception sensitivity of the receiver circuits.

Note that, as illustrated in FIG. 2A and FIG. 2B, external-connection terminals 150 may be columnar electrodes penetrating through resin component 93 in the z-axis direction, or may be bump electrodes formed on principal surface 91b. When external-connection terminals 150 are bump electrodes, resin component 93 on the principal surface 91b side need not be provided.

In radio frequency module 1A according to this working example, transmission power amplifiers 11 and 12 are mounted on principal surface 91a.

Among the circuit components included in radio frequency module 1A, transmission power amplifiers 11 and 12 are components that generate a large amount of heat. To enhance the heat dissipating properties of radio frequency module 1A, it is important to dissipate heat generated by transmission power amplifiers 11 and 12 to the motherboard via a heat dissipation path having small thermal resistance. If transmission power amplifiers 11 and 12 are mounted on principal surface 91b, electrode lines connected to transmission power amplifiers 11 and 12 are disposed on principal surface 91b. Thus, the heat dissipation path in such a case includes a heat dissipation path passing only through a planar line pattern on principal surface 91b (along the xy plane direction). Since this planar line pattern is formed with a metal thin film, the thermal resistance is large. Consequently, the heat dissipating properties decrease if transmission power amplifiers 11 and 12 are disposed on principal surface 91b.

In contrast, when transmission power amplifiers 11 and 12 are mounted on principal surface 91a, transmission power amplifiers 11 and 12 and external-connection terminals 150 can be connected via a penetrating electrode that penetrates through module board 91 between principal surfaces 91a and 91b. Thus, the heat dissipation paths of transmission power amplifiers 11 and 12 can exclude a heat dissipation path that passes only through a planar line pattern having large thermal resistance and formed along the xy plane direction among the lines in module board 91. Accordingly, it is possible to provide miniaturized radio frequency module 1A having enhanced heat dissipating properties for dissipating heat from transmission power amplifiers 11 and 12 to the motherboard.

It is desirable that a footprint of the switch 53 mounted on principal surface 91b does not overlap a footprint of the transmission power amplifier 11 mounted on principal surface 91a in a plan view of module board 91.

According to this, switch 53 disposed in reception paths and transmission power amplifier 11 can be disposed with module board 91 interposed therebetween. In addition, a sufficient distance can be ensured between switch 53 and transmission power amplifier 11.

Accordingly, isolation between the transmitter circuits and the receiver circuits improves, thus enabling further reduction of deterioration of the reception sensitivity caused by a flow of a transmission signal, a harmonic, and spurious waves of intermodulation distortion into a reception path.

As illustrated in radio frequency module 1A according to this working example, it is desirable that a footprint of the inductor of matching circuit 41 mounted on principal surface 91a and a footprint of switch 53 mounted on principal surface 91b overlap in a plan view of module board 91. According to this, since the inductor of matching circuit 41 and switch 53 are disposed in opposite positions on opposite sides of module board 91, it is possible to shorten a length of a line connecting the inductor of matching circuit 41 and switch 53. Accordingly, transfer loss in the reception paths can be reduced.

As illustrated in radio frequency module 1A according to this working example, it is desirable that a footprint of at least one of duplexer 61 (or reception filter 61R) or duplexer 62 (or reception filter 62R) mounted on principal surface 91a overlap with a footprint of switch 53 mounted on principal surface 91b in a plan view of module board 91. According to this, since at least one of duplexers 61 and 62 and switch 53 are disposed in opposite positions on opposite sides of module board 91, it is possible to shorten a length of a line connecting at least one of duplexers 61 and 62 and switch 53. Accordingly, transfer loss in the reception paths can be reduced.

Additionally, in radio frequency module 1A according to this working example, a footprint of diplexer 60 overlaps with a footprint of switch 55 in a plan view of module board 91. In this working example, switch 55 and the third inductor included in diplexer 60 are connected via via conductor 91v that penetrates through module board 91 between principal surfaces 91a and 91b.

According to this, since diplexer 60 and switch 55 are disposed in opposite positions on opposite sides of module board 91, it is possible to shorten a length of a line connecting diplexer 60 and switch 55. As a result, transfer loss in both the transmission paths and the reception paths of radio frequency module 1A can be reduced.

As illustrated in radio frequency module 1A according to this working example, it is desirable that transmission power amplifier 11, switch 51, and duplexer 61 or 62 (or transmission filter 61T or 62T) be disposed in the stated order in a plan view of module board 91. According to this, transmission power amplifier 11, switch 51, and duplexer 61 or 62 are disposed in the same order as the electrical connection order. As a result, it is possible to shorten a length of a line connecting transmission power amplifier 11, switch 51, and duplexer 61 or 62. Accordingly, transfer loss in the transmission paths can be reduced.

Note that reception low noise amplifiers 21 and 22 and switches 53 and 54 may be embedded in single semiconductor IC 10. This makes it possible to reduce the height on the principal surface 91b side in the z-axis direction, and reduce the component mounting area of principal surface 91b. Thus, radio frequency module 1A can be miniaturized.

Note that in radio frequency module 1A according to this working example, transmission power amplifiers 11 and 12, duplexers 61 to 64, matching circuits 41 and 42, and diplexer 60 may be disposed on principal surface 91b. Reception low noise amplifiers 21 and 22 and switches 53 to 55 may be disposed on principal surface 91a.

In this working example, external-connection terminals 150 may be disposed on principal surface 91a.

[3. Advantageous Effects Etc.]

Radio frequency module 1A according to this working example is a radio frequency module including: module board 91 including principal surfaces 91a and 91b on opposite sides of module board 91; transmission power amplifier 11 configured to amplify a transmission signal; switch 51; and a first inductor included in matching circuit 31 connected between an output terminal of transmission power amplifier 11 and switch 51. The first inductor is disposed on principal surface 91a, and switch 51 is disposed on principal surface 91b.

According to the above configuration, the first inductor and switch 51 are disposed on the principal surfaces of module board 91 with module board 91 interposed therebetween. According to this, it is possible to reduce electromagnetic coupling between the first inductor and switch 51 which occurs when high-output transmission signals of communication bands A and B output from transmission power amplifier 11 are transferred via transmission paths AT and BT. Accordingly, it is possible to provide miniaturized radio frequency module 1A that reduces the deterioration of the quality of a transmission signal.

Radio frequency module 1A may further include transmission filters 61T and 62T. Switch 51 may be configured to switch between connection of transmission power amplifier 11 and transmission filter 61T and connection of transmission power amplifier 11 and transmission filter 62T.

In radio frequency module 1A, the first inductor may be a circuit element configured to match an impedance of transmission power amplifier 11 and an impedance of transmission filter 61T, and match the impedance of transmission power amplifier 11 and an impedance of transmission filter 62T.

In radio frequency module 1A, module board 91 may include ground electrode layer 95g along a direction parallel to principal surfaces 91a and 91b, and in a plan view of module board 91, a footprint of the first inductor may at least partially overlap with a footprint of ground electrode layer 95g, and a footprint of switch 51 may at least partially overlap with a footprint of ground electrode layer 95g.

According to this, with the electromagnetic-field shielding function of ground electrode layer 95g, it is possible to inhibit the electromagnetic field generated by the first inductor from reaching the principal surface 91b side and inhibit the electromagnetic field generated by switch 51 from reaching the principal surface 91a side. It is thus possible to further reduce the electromagnetic coupling between the first inductor and switch 51.

In radio frequency module 1A, in a plan view of module board 91, a footprint of the first inductor may at least partially overlap with a footprint of switch 51.

According to this, since the first inductor and switch 51 are disposed in opposite positions on opposite sides of module board 91, it is possible to shorten a length of a line connecting matching circuit 31 and switch 51, and reduce transfer loss of transmission signals of communication bands A and B.

Radio frequency module 1A may further include a plurality of external-connection terminals 150 disposed on principal surface 91b.

In radio frequency module 1A, transmission power amplifier 11 may be disposed on principal surface 91a.

According to this, transmission power amplifier 11 and external-connection terminals 150 can be connected via a penetrating electrode that penetrates through module board 91 between principal surfaces 91a and 91b. Thus, the heat dissipation path of transmission power amplifier 11 can exclude a heat dissipation path that passes only through a planar line pattern having large thermal resistance and formed along the xy plane direction among the lines in module board 91. Accordingly, it is possible to provide miniaturized radio frequency module 1A having enhanced heat dissipating properties for dissipating heat from transmission power amplifier 11 to the motherboard.

Radio frequency module 1A may further include reception low noise amplifier 21 configured to amplify a reception signal. Reception low noise amplifier 21 may be disposed on principal surface 91b.

According to this, transmission power amplifier 11 that cannot be readily reduced in profile is not disposed on principal surface 91b facing the motherboard, but reception low noise amplifier 21 and switch 51 that can be readily reduced in profile are disposed on principal surface 91b, thus enabling profile reduction of radio frequency module 1A as a whole. Moreover, since a plurality of external-connection terminals 150 that are used as ground electrodes are disposed in the vicinity of reception low noise amplifier 21 that has a significant impact on the reception sensitivity of the receiver circuits, it is possible to reduce deterioration of the reception sensitivity of the receiver circuits.

Communication device 5 includes: RFIC 3 configured to process a radio frequency signal which is to be transmitted by antenna 2 and a radio frequency signal which has been received by antenna 2; and radio frequency module 1A configured to transfer the radio frequency signals between antenna 2 and RFIC 3.

According to this, it is possible to provide miniaturized communication device 5 that reduces deterioration of the quality of a transmission signal.

Other Embodiments, Etc.

Although a radio frequency module and a communication device according to an embodiment of the present disclosure have been described based on the embodiment and working examples, the radio frequency module and the communication device according to the present disclosure are not limited to the above embodiment and working examples. The present disclosure also encompasses: other embodiments implemented by arbitrarily combining constituent elements in the above embodiment and working examples; variations obtained by making various modifications to the above embodiment and working examples that are conceivable to a person skilled in the art within the scope of the essence of the present disclosure; and various apparatuses that include the above radio frequency module and communication device.

For example, in the radio frequency module and the communication device according to the above embodiment and working examples thereof, circuit elements and lines, for instance, may be interposed between circuit elements and paths that connect signal paths illustrated in the drawings.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is widely applicable to communication apparatuses such as mobile phones as a radio frequency module disposed in a multiband-compatible front-end unit.

The invention claimed is:
1. A radio frequency (RF) module, comprising:
a module board including a first principal surface and a second principal surface;

a power amplifier configured to amplify a transmission signal;
a first transmission filter;
a second transmission filter;
a first switch disposed on the second principal surface and configured to switch between connection of the power amplifier and the first transmission filter and connection of the power amplifier and the second transmission filter; and
a first inductor disposed on the first principal surface and connected between an output terminal of the power amplifier and the first switch.

2. The RF module of claim 1, wherein
the first principal surface opposes the second principal surface.

3. The RF module of claim 1, wherein
the first inductor is a circuit element configured to match an impedance of the power amplifier and an impedance of the first transmission filter.

4. The RF module of claim 3, wherein
the first inductor is configured to match the impedance of the power amplifier and an impedance of the second transmission filter.

5. The RF module of claim 1, wherein
the module board includes a ground electrode layer along a direction parallel to the first principal surface and the second principal surface.

6. The RF module of claim 5, wherein
in a plan view of the module board, a footprint of the first inductor at least partially overlaps with a footprint of the ground electrode.

7. The RF module of claim 6, wherein
in the plan view of the module board, a footprint of the first switch at least partially overlaps a footprint of the ground electrode.

8. The RF module of claim 1, wherein
in a plan view of the module board, a footprint of the first inductor at least partially overlaps with a footprint of the first switch.

9. The RF module of claim 1, further comprising:
a plurality of external-connection terminals disposed on the second principal surface.

10. The RF module according to claim 1, wherein
the power amplifier is disposed on the first principal surface.

11. The RF module of claim 1, further comprising:
a low noise amplifier configured to amplify a reception signal.

12. The RF module of claim 11, wherein
the low noise amplifier is disposed on the second principal surface.

13. A communication device, comprising:
a radio frequency (RF) signal processing circuit configured to process a radio frequency signal which is to be transmitted by an antenna and a radio frequency signal which has been received by the antenna; and
an RF module configured to transfer the radio frequency signals between the antenna and the RF signal processing circuit, wherein,
the RF module comprises
a module board including a first principal surface and a second principal surface on opposite sides of the module board;
a power amplifier configured to amplify a transmission signal;
a first transmission filter;
a second transmission filter;
a first switch disposed on the second principal surface and configured to switch between connection of the power amplifier and the first transmission filter and connection of the power amplifier and the second transmission filter; and
a first inductor disposed on the first principal surface and connected between an output terminal of the power amplifier and the first switch.

14. The communication device of claim 13, wherein
the first inductor is a circuit element configured to match an impedance of the power amplifier and an impedance of the first transmission filter, and
the first inductor is configured to match the impedance of the power amplifier and an impedance of the second transmission filter.

15. The communication device of claim 13, wherein
the module board includes a ground electrode layer along a direction parallel to the first principal surface and the second principal surface, and
in a plan view of the module board, a footprint of the first inductor at least partially overlaps with a footprint of the first switch.

16. The communication device of claim 13, wherein the RF module further comprises:
a plurality of external-connection terminals disposed on the second principal surface; and
a low noise amplifier configured to amplify a reception signal.

17. The communication device of claim 16, wherein
the power amplifier is disposed on the first principal surface, and
the low noise amplifier is disposed on the second principal surface.

18. A radio frequency (RF) module, comprising:
a module board including a first principal surface and a second principal surface;
a power amplifier configured to amplify a transmission signal;
a first switch disposed on the second principal surface; and
a first inductor disposed on the first principal surface and connected between an output terminal of the power amplifier and the first switch, wherein
in a plan view of the module board, a footprint of the first inductor at least partially overlaps with a footprint of the first switch.

19. The RF module of claim 18, wherein
the first principal surface opposes the second principal surface.

20. The RF module of claim 18, further comprising:
a first transmission filter; and
a second transmission filter, wherein
the first switch is configured to switch between connection of the power amplifier and the first transmission filter and connection of the power amplifier and the second transmission filter.

* * * * *